United States Patent
Takahashi et al.

(10) Patent No.: US 11,274,250 B2
(45) Date of Patent: Mar. 15, 2022

(54) CHEMICAL SOLUTION AND METHOD FOR TREATING SUBSTRATE

(71) Applicant: FUJIFILM Corporation, Tokyo (JP)

(72) Inventors: Tomonori Takahashi, Haibara-gun (JP); Nobuaki Sugimura, Haibara-gun (JP); Hiroyuki Seki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/924,800

(22) Filed: Jul. 9, 2020

(65) Prior Publication Data

US 2020/0347299 A1     Nov. 5, 2020

Related U.S. Application Data

(63) Continuation of application No. PCT/JP2018/046714, filed on Dec. 19, 2018.

(30) Foreign Application Priority Data

Jan. 12, 2018 (JP) .............................. JP2018-003471

(51) Int. Cl.
C09K 13/06 (2006.01)
H01L 21/02 (2006.01)
H01L 21/3213 (2006.01)

(52) U.S. Cl.
CPC ........ *C09K 13/06* (2013.01); *H01L 21/02068* (2013.01); *H01L 21/32134* (2013.01)

(58) Field of Classification Search
CPC .............. C09K 13/06; H01L 21/02068; H01L 21/32134

(Continued)

(56) References Cited

U.S. PATENT DOCUMENTS

2003/0017419 A1 * 1/2003 Futase ................. C23F 1/30
430/311
2005/0165073 A1 * 7/2005 Hong .................. C07D 275/03
514/372

(Continued)

FOREIGN PATENT DOCUMENTS

| CN | 1671674 A | 9/2005 |
| JP | 2001-240985 A | 9/2001 |

(Continued)

OTHER PUBLICATIONS

International Search Report dated Feb. 5, 2019, issued by the International Searching Authority in application No. PCT/JP2018/046714.

(Continued)

*Primary Examiner* — Duy Vu N Deo
(74) *Attorney, Agent, or Firm* — Sughrue Mion, PLLC

(57) ABSTRACT

The present invention provides a chemical solution, which has an excellent dissolving ability for a transition metal-containing substance and can realize excellent smoothness of a portion to be treated, and a treatment method using the chemical solution. The chemical solution according to an embodiment of the present invention is a chemical solution used for removing a transition metal-containing substance on a substrate and includes periodic acids and a compound including one or more kinds of anions selected from the group consisting of $IO_3^-$, $I^-$, and $I_3^-$, in which a content of the compound including anions with respect to a total mass of the chemical solution is 5 ppb by mass to 1% by mass.

34 Claims, 2 Drawing Sheets

(58) Field of Classification Search
USPC .......................................................... 438/754
See application file for complete search history.

(56) References Cited

U.S. PATENT DOCUMENTS

| | | | |
|---|---|---|---|
| 2009/0212021 A1 | 8/2009 | Bernhard et al. | |
| 2016/0257856 A1* | 9/2016 | Reiss ..................... | C09G 1/02 |
| 2017/0222138 A1 | 8/2017 | Park et al. | |

FOREIGN PATENT DOCUMENTS

| JP | 2002-016053 A | 1/2002 |
|---|---|---|
| JP | 2016-092101 A | 5/2016 |
| KR | 10-2008-0015027 A | 2/2008 |
| KR | 10-0907767 B1 | 7/2009 |
| TW | 201631645 A | 9/2016 |
| TW | 201634755 A | 10/2016 |
| WO | 03/099799 A1 | 12/2003 |
| WO | 2016/068183 A1 | 5/2016 |

OTHER PUBLICATIONS

Written Opinion dated Feb. 5, 2019, issued by the International Searching Authority in application No. PCT/JP2018/046714.
International Preliminary Report on Patentability dated Jul. 14, 2020, issued by the International Bureau in application No. PCT/JP2018/046714.
Communication dated Nov. 8, 2021 from the Taiwanese Patent Office in Taiwanese Application No. 107147267.
Office Action dated Jan. 3, 2022, issued by the Korean Intellectual Property Office in application No. 10-2020-7020048.
Cheng et al., "Galvanic Corrosion Inhibitors for Cu/Ru Couple during Chemical Mechanical Polishing of RU", ECS Journal of Solid State Science and Technology, 2017, vol. 6, No. 1, pp. P62-P67 (6 pages total).

* cited by examiner

CHEMICAL SOLUTION AND METHOD FOR TREATING SUBSTRATE

CROSS-REFERENCE TO RELATED APPLICATIONS

This application is a Continuation of PCT International Application No. PCT/JP2018/046714 filed on Dec. 19, 2018, which claims priority under 35 U.S.C. § 119(a) to Japanese Patent Application No. 2018-003471 filed on Jan. 12, 2018. The above application is hereby expressly incorporated by reference, in its entirety, into the present application.

BACKGROUND OF THE INVENTION

1. Field of the Invention

The present invention relates to a chemical solution and a method for treating a substrate.

2. Description of the Related Art

As the miniaturization of semiconductor products progresses, there is an increasing demand for performing a step of removing unnecessary transition metal-containing substances on a substrate in a semiconductor product manufacturing process with high efficiency and high accuracy.

JP2016-092101A describes "method for treating a substrate on which a ruthenium-containing film is formed, including a step of removing ruthenium deposits attached to the outer edge portion of a surface of the substrate on which the ruthenium-containing film is formed and/or ruthenium deposits attached to a back surface of the substrate by using a remover solution, wherein a content of orthoperiodic acid in the remover solution with respect to a total mass of the remover solution is 0.05% to 8% by mass, and a pH of the remover solution is equal to or lower than 3.5 (claim 1)".

SUMMARY OF THE INVENTION

In recent years, it has been also required to reduce the roughness (surface roughness) of a portion to be treated at the time of removing unnecessary transition metal-containing substances on a substrate. In a case where the roughness of the portion to be treated is high, sometimes the lamination properties of substances to be laminated on the portion to be treated deteriorate, which leads to the deterioration of the performance of semiconductor products.

The inventors of the present invention examined the removability of transition metal-containing substances by using the method disclosed in JP2016-092101A. As a result, the inventors have found that the dissolving ability for the transition metal-containing substances and the smoothness of the portion to be treated are not necessarily simultaneously achieved to a sufficient degree and need to be further improved.

Therefore, an object of the present invention is to provide a chemical solution, which has an excellent dissolving ability for a transition metal-containing substance and can realize excellent smoothness of a portion to be treated, and a method for treating a substrate by using the chemical solution.

In order to achieve the above object, the inventors of the present invention conducted intensive examinations. As a result, the inventors have found that by a chemical solution including periodic acids and a predetermined amount of a compound, the above object can be achieved, and have accomplished the present invention.

That is, the inventors have found that the above object can be achieved by the following constitution.

[1] A chemical solution used for removing a transition metal-containing substance on a substrate, including
one or more kinds of periodic acids selected from the group consisting of a periodic acid and a salt thereof, and
a compound including one or more kinds of anions selected from the group consisting of $IO_3^-$, $I^-$, and $I_3^-$,
in which a content of the compound including anions with respect to a total mass of the chemical solution is 5 ppb by mass to 1% by mass.

[2] The chemical solution described in [1], in which the periodic acids include at least one kind of compound selected from the group consisting of orthoperiodic acid, a salt of orthoperiodic acid, metaperiodic acid, and a salt of metaperiodic acid.

[3] The chemical solution described in [1] or [2], in which a content of the periodic acids with respect to the total mass of the chemical solution is equal to or smaller than 37.0% by mass.

[4] The chemical solution described in any one of [1] to [3], in which a content of the periodic acids with respect to the total mass of the chemical solution is 2.0% to 8.0% by mass.

[5] The chemical solution described in any one of [1] to [4], in which a ratio of a content of the periodic acids to the content of the compound including anions is $1 \times 10^0$ to $1 \times 10^8$.

[6] The chemical solution described in any one of [1] to [5], in which the compound including anions includes at least one kind of compound selected from the group consisting of iodic acid, tetramethylammonium iodate, tetraethylammonium iodate, tetrabutylammonium iodate, ammonium iodate, hydrogen iodide, tetramethylammonium iodide, tetraethylammonium iodide, tetrabutylammonium iodide, ammonium iodide, and nitrogen triiodide.

[7] The chemical solution described in any one of [1] to [6], in which the compound including anions includes a cation selected from the group consisting of a hydrogen cation, a tetramethylammonium cation, a tetraethylammonium cation, and a tetrabutylammonium cation.

[8] The chemical solution described in any one of [1] to [7], in which the transition metal-containing substance includes at least one kind of metal selected from the group consisting of Ru, Ti, Ta, Co, Cr, Hf, Os, Pt, Ni, Mn, Cu, Zr, Mo, La, W, and Ir.

[9] The chemical solution described in any one of [1] to [8], in which the transition metal-containing substance includes a Ru-containing substance.

[10] The chemical solution described in any one of [1] to [9], further including a pH adjuster.

[11] The chemical solution described in [10], in which the pH adjuster includes at least one kind of compound selected from the group consisting of tetramethylammonium hydroxide, tetraethylammonium hydroxide, tetrabutylammonium hydroxide, aqueous ammonia, a water-soluble amine, sulfuric acid, hydrochloric acid, acetic acid, nitric acid, hydrofluoric acid, perchloric acid, and hypochlorous acid.

[12] The chemical solution described in [10] or [11], in which the pH adjuster includes at least one kind of compound selected from the group consisting of tetramethylammonium hydroxide, tetraethylammonium hydroxide, tetrabutylammonium hydroxide, aqueous ammonia, and a water-soluble amine.

[13] The chemical solution described in any one of [1] to [12] that has a pH lower than 8.0.

[14] The chemical solution described in any one of [1] to [13] that has a pH of 2.5 to 5.0.

[15] A method for treating a substrate, having a step A of removing a transition metal-containing substance on a substrate by using the chemical solution described in any one of [1] to [14].

[16] The method for treating a substrate described in [15], in which the transition metal-containing substance includes a Ru-containing substance.

[17] The method for treating a substrate described in [15] or [16], in which the step A is a step A1 of performing a recess etching treatment on transition metal-containing wiring disposed on a substrate by using the chemical solution, a step A2 of removing a transition metal-containing film at an outer edge portion of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, or a step A5 of removing a transition metal-containing substance on a substrate, which has undergone a chemical mechanical polishing treatment, by using the chemical solution.

[18] The method for treating a substrate described in [17] that has the step A1 as the step A, further having a step B of treating the substrate obtained by the step A1 by using a solution selected from the group consisting of a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide after the step A1.

[19] The method for treating a substrate described in [18], in which the step A1 and the step B are alternately repeated.

[20] The method for treating a substrate described in any one of [15] to [17], further having a step C of performing a rinsing treatment on the substrate obtained by the step A by using a rinsing solution after the step A.

[21] The method for treating a substrate described in [20], in which the rinsing solution is a solution selected from the group consisting of hydrofluoric acid, hydrochloric acid, aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, and an aqueous orthoperiodic acid solution.

[22] The method for treating a substrate described in any one of [15] to [21], in which a temperature of the chemical solution is 20° C. to 75° C.

According to the present invention, it is possible to provide a chemical solution, which has an excellent dissolving ability for a transition metal-containing substance and can realize excellent smoothness of a portion to be treated, and a treatment method using the chemical solution.

DESCRIPTION OF THE PREFERRED EMBODIMENTS

Figure 1:
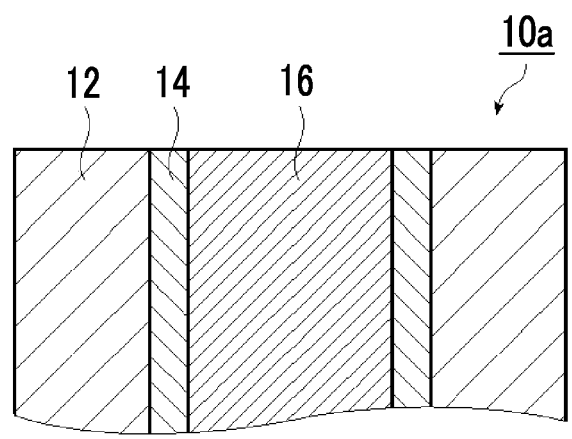
FIG. 1 is a schematic cross-sectional top view showing an example of an object to be treated used in a step A1.

Hereinafter, the present invention will be specifically described.

The following constituents will be described based on typical embodiments of the present invention in some cases, but the present invention is not limited to the embodiments.

In the present specification, in a case where there is no description regarding whether a group (atomic group) is substituent or unsubstituted, as long as the effects of the present invention are not reduced, the group includes both the group having no substituent and the group having a substituent. For example, "alkyl group" includes not only an alkyl group having no substituent (unsubstituted alkyl group) but also an alkyl group having a substituent (substituted alkyl group). The same is true of each compound.

In the present specification, unless otherwise specified, "exposure" includes not only the exposure using a mercury lamp, far ultraviolet rays represented by an excimer laser, X-rays, and Extreme Ultraviolet (EUV) light, but also lithography by particle beams such as electron beams and ion beams.

In the present specification, a range of numerical values described using "to" means a range including numerical values described before and after "to" as a lower limit and an upper limit.

In the present specification, a dry etching residue is a by-product generated as a result of performing dry etching (for example, plasma etching). For example, the dry etching residue refers to an organic residue derived from a photoresist, a Si-containing residue, a metal-containing residue (for example, a transition metal-containing residue), and the like.

[Chemical Solution]

The chemical solution according to an embodiment of the present invention includes one or more kinds of periodic acids selected from the group consisting of a periodic acid and a salt thereof, and a compound (hereinafter, referred to as "specific compound" as well) including one or more kinds of anions selected from the group consisting of $IO_3^-$, $I^-$, and $I_3^-$, in which the content of the specific compound is within a predetermined range.

It is unclear what mechanism operates to achieve the object of the present invention by the use of the chemical solution according to the embodiment of the present invention. Presumably, because the chemical solution includes the periodic acids, an excellent dissolving ability for transition metals may be realized, and because the chemical solution includes a predetermined amount of the specific compound, the roughness of a portion to be treated may be improved.

<Periodic Acids>

The chemical solution of the present invention includes periodic acids.

In the present specification, "periodic acids" is a generic term for compounds selected from the group consisting of a periodic acid and a salt thereof.

Periodic acids are not particularly limited. However, from the viewpoint of being able to dissolve a transition metal film represented by ruthenium, one or more kinds of compounds selected from the group consisting of orthoperiodic acid ($H_5IO_6$), a salt of orthoperiodic acid, metaperiodic acid ($HIO_4$), and a salt of metaperiodic acid are preferable, and orthoperiodic acid or metaperiodic acid is more preferable. Particularly, orthoperiodic acid is preferable because it does not include an alkali metal such as sodium (Na) and the composition thereof is stable.

In view of further improving the dissolving ability of the chemical solution, the content of the periodic acids (total content in a case where the chemical solution includes a plurality of periodic acids) with respect to the total mass of the chemical solution is preferably equal to or greater than 0.1% by mass, more preferably equal to or greater than 0.5% by mass, even more preferably equal to or greater than 2.0% by mass, particularly preferably equal to or greater than 8.0% by mass, and most preferably equal to or greater than 15.0% by mass.

In view of further improving the smoothness of a portion to be treated, the content of the periodic acid with respect to the total mass of the chemical solution is preferably equal to or smaller than 40.0% by mass, more preferably equal to or smaller than 37.0% by mass, even more preferably equal to or smaller than 35.0% by mass, particularly preferably equal to or smaller than 15.0% by mass, and most preferably equal to or smaller than 8.0% by mass.

In view of further improving the balance between the dissolving ability of the chemical solution and the smoothness of the portion to be treated, the content of the periodic acids with respect to the total mass of the chemical solution is, for example, preferably 0.5% to 35.0% by mass, and more preferably 2.0% to 8.0% by mass.

<Specific Compound>

The chemical solution according to the embodiment of the present invention includes a specific compound.

The specific compound is a compound including one or more kinds of anions selected from the group consisting of $IO_3^-$, $I^-$, and $I_3^-$. Usually, the specific compound is a compound constituted with the anions described above and cations. The specific compound corresponds to a compound which can supply $IO_3^-$, $I^-$, or $I_3^-$ by dissociating in a solvent. Note that $I_3^-$ can turn into $I^-$ by equilibrium.

The chemical solution according to the embodiment of the present invention may include only a compound including $IO_3^-$, only a compound including $I^-$, only a compound including $I_3^-$, or a mixture of these. Particularly, the chemical solution according to the embodiment of the present invention preferably includes a compound including $IO_3^-$.

In view of further improving the dissolving ability of the chemical solution, the content of the specific compound with respect to the total mass of the chemical solution is equal to or smaller than 1% by mass, preferably less than 1% by mass, and more preferably equal to or smaller than 0.1% by mass.

In view of further improving the smoothness of the portion to be treated, the content of the specific compound with respect to the total mass of the chemical solution is equal to or greater than 5 ppb by mass, preferably greater than 5 ppb by mass, more preferably equal to or greater than 5 ppm by mass, and even more preferably equal to or greater than 0.1% by mass.

In view of further improving the balance between the dissolving ability of the chemical solution and the smoothness of the portion to be treated, the content of the specific compound with respect to the total mass of the chemical solution is, for example, preferably 5 ppm by mass to 1% by mass.

In addition, in view of further improving the balance between the dissolving ability of the chemical solution and the smoothness of the portion to be treated, a ratio of the content of the specific compound to the content of the periodic acids (content of periodic acids/content of specific compound (mass ratio)) is preferably $1 \times 10^0$ to $1 \times 10^8$, and more preferably $8 \times 10^0$ to $1.6 \times 10^7$.

As the specific compound, a compound that dissociates in an aqueous solution is preferable.

Examples of the specific compound include compounds represented by $XIO_3$, $XI$, or $XI_3$. Herein, X represents a cation in the compound.

As the cation, for example, a hydrogen cation ($H^+$), a tetraalkylammonium cation (for example, a tetramethylammonium cation ($TMA^+$), a tetraethylammonium cation ($TEA^+$), or a tetrabutylammonium cation (TBA+)) or an ammonium cation ($NH_4^+$) is preferable, a hydrogen cation, a tetramethylammonium cation, a tetraethylammonium cation, or a tetrabutylammonium cation is more preferable, and a hydrogen cation is even more preferable.

Specific examples of the specific compound include iodic acid ($HIO_3$), tetramethylammonium iodate ($TMAIO_3$), tetraethylammonium iodate ($TEAIO_3$), tetrabutylammonium iodate ($TBAIO_3$), ammonium iodate ($NH_4IO_3$), hydrogen iodide (HI), tetramethylammonium iodide (TMAI), tetraethylammonium iodide (TEAI), tetrabutylammonium iodide (TBAI), ammonium iodide ($NH_4I$), and nitrogen triiodide ($NI_3$).

Among these, as the specific compound, iodic acid, tetramethylammonium iodate, tetraethylammonium iodate, tetrabutylammonium iodate, or ammonium iodate is preferable, iodic acid, tetramethylammonium iodate, tetraethylammonium iodate, or tetrabutylammonium iodate is more preferable, and iodic acid is even more preferable.

As the specific compound, hydrogen iodide, tetramethylammonium iodide, tetraethylammonium iodide, tetrabutylammonium iodide, or ammonium iodide is preferable, hydrogen iodide, tetramethylammonium iodide, tetraethylammonium iodide, or tetrabutylammonium iodide is more preferable, and hydrogen iodide is even more preferable.

One kind of specific compound may be used singly, or two or more kinds of specific compounds may be used.

<Optional Components>

The chemical solution according to the embodiment of the present invention may include other optional components in addition to the components described above. Hereinafter, the optional components will be described.

(PH Adjuster)

The chemical solution according to the embodiment of the present invention may include a pH adjuster.

Examples of the pH adjuster include an organic base, an inorganic base, an organic acid, and an inorganic acid. Among these, an organic base or an inorganic base is preferable, and an organic base is more preferable.

Specifically, as the pH adjuster, for example, a quaternary ammonium salt compound, aqueous ammonia, a water-soluble amine, sulfuric acid, hydrochloric acid, acetic acid, nitric acid, hydrofluoric acid, perchloric acid, or hypochlorous acid is preferable.

As the quaternary ammonium salt compound, a compound represented by Formula (1) is preferable.

(Formula 1)

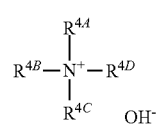

In Formula (1), $R^{4A}$ to $R^{4D}$ each independently represent an alkyl group having 1 to 6 carbon atoms, a hydroxyalkyl group having 1 to 6 carbon atoms, a benzyl group, or an aryl group.

In Formula (1), $R^{4A}$ to $R^{4D}$ each independently represent an alkyl group having 1 to 6 carbon atoms (for example, a methyl group, an ethyl group, a butyl group, or the like), a hydroxyalkyl group having 1 to 6 carbon atoms (for example, a hydroxymethyl group, a hydroxyethyl group, a hydroxybutyl group, or the like), a benzyl group, or an aryl group (for example, a phenyl group, a naphthyl group, a naphthalene group, or the like). Among these, an alkyl group, a hydroxyethyl group, or a benzyl group is preferable.

As the compound represented by Formula (1), at least one kind of quaternary ammonium hydroxide salt is preferable which is selected from the group consisting of tetramethylammonium hydroxide (TMAH), tetraethylammonium hydroxide (TEAH), tetrabutylammonium hydroxide (TBAH), trimethylhydroxyethylammonium hydroxide, methyltri(hydroxyethyl)ammonium hydroxide, tetra(hydroxyethyl)ammonium hydroxide, trimethylbenzylammonium hydroxide, bishydroxyethyldimethylammonium hydroxide, and choline. Among these, as the compound represented by Formula (1), at least one kind of compound is preferable which is selected from the group consisting of tetramethylammonium hydroxide, tetraethylammonium hydroxide, and tetrabutylammonium hydroxide.

Furthermore, the quaternary ammonium hydroxide compound described in JP2015-518068A may be also used. For example, tetramethylammonium hydroxide, bishydroxyethyldimethylammonium hydroxide, or trimethyl(hydroxyethyl)ammonium hydroxide is preferable because these compounds are effective for removing a transition metal-containing substance, leave few metal residues after use, are economical, and contribute to the stability of the chemical solution.

One kind of quaternary ammonium salt compound may be used singly, or two or more kinds of quaternary ammonium salt compounds may be used.

A pka of the water-soluble amine is preferably 7.5 to 13.0. In the present specification, the water-soluble amine means an amine which can dissolve in an amount equal to or greater than 50 g in 1 L of water. Aqueous ammonia is not included in the water-soluble amine.

Examples of the water-soluble amine having a pKa of 7.5 to 13 include diglycolamine (DGA) (pKa=9.80), methylamine (pKa=10.6), ethylamine (pKa=10.6), propylamine (pKa=10.6), butylamine (pKa=10.6), pentylamine (pKa=10.0), ethanolamine (pKa=9.3), propanolamine (pKa=9.3), butanol amine (pKa=9.3), methoxyethylamine (pKa=10.0), methoxypropylamine (pKa=10.0), dimethylamine (pKa=10.8), diethylamine (pKa=10.9), diamine propylamine (pKa=10.8), trimethylamine (pKa=9.80), and triethylamine (pKa=10.72).

As the water-soluble amine, unsubstituted hydroxylamine and a hydroxylamine derivative may also be used.

In the present specification, the pka of the water-soluble amine is an acid dissociation constant in water. The acid dissociation constant in water can be measured using a spectrometer and potentiometry in combination.

Particularly, as the pH adjuster, tetramethylammonium hydroxide, tetraethylammonium hydroxide, tetrabutylammonium hydroxide, aqueous ammonia, a water-soluble amine (such as diglycolamine (DGA)), sulfuric acid, hydrochloric acid, acetic acid, nitric acid, hydrofluoric acid, perchloric acid, or hypochlorous acid is more preferable, and tetramethylammonium hydroxide, tetraethylammonium hydroxide, tetrabutylammonium hydroxide, aqueous ammonia, or a water-soluble amine is even more preferable.

As the pH adjuster, for example, tetramethylammonium hydroxide, bishydroxyethyldimethylammonium hydroxide, or trimethyl(hydroxyethyl)ammonium hydroxide is preferable because these compounds are effective for removing a transition metal-containing substance, leave few metal residues after use, are economical, and contribute to the stability of the chemical solution.

(Solvent)

The chemical solution may include a solvent.

Examples of the solvent include water and an organic solvent. Among these, water is preferable.

Water may include a trace of components that are unavoidably mixed in.

Particularly, water having undergone a purification treatment such as distilled water, deionized water, or ultrapure water is preferable, and ultrapure water used for manufacturing semiconductors is more preferable.

The concentration of water in the chemical solution is not particularly limited, but is preferably equal to or higher than 50% by mass, more preferably equal to or higher than 60% by mass, and even more preferably equal to or higher than 85% by mass. The upper limit thereof is not particularly limited, but is preferably equal to or lower than 99.9% by mass, and more preferably equal to or lower than 92% by mass.

The chemical solution according to the embodiment of the present invention may include other components in addition to the components described above.

Those other components are not particularly limited, and examples thereof include known components. Examples of the components include the surfactants described in paragraph "0026" of JP2014-093407A, paragraphs "0024" to "0027" of JP2013-055087A, paragraphs "0024" to "0027" of JP2013-012614A, and the like.

Examples thereof also include the additives (anticorrosive and the like) disclosed in paragraphs "0017" to "0038" of JP2014-107434A, paragraphs "0033" to "0047" of JP2014-103179A, paragraphs "0017" to "0049" of JP2014-093407A, and the like.

The pH of the chemical solution according to the embodiment of the present invention is not particularly limited, but is equal to or lower than 10.0 in many cases. Especially, in view of further improving the balance between the dissolving ability of the chemical solution and the smoothness of the portion to be treated, the pH of the chemical solution is preferably lower than 8.0, more preferably higher than 1.0 and equal to or lower than 6.0, even more preferably 2.5 to 5.0, and particularly preferably 3.0 to 5.0.

That is, in a case where the chemical solution includes a pH adjuster, the content of the pH adjuster with respect to the total mass of the chemical solution is preferably set such that the pH of the chemical solution falls into the above range.

In the present specification, the pH of the chemical solution is a value measured at room temperature (25° C.) by using F-51 (trade name) manufactured by Horiba, Ltd.

The method for manufacturing the chemical solution according to the embodiment of the present invention is not particularly limited, and examples thereof include a method of thoroughly mixing together predetermined raw materials by using a stirrer such as a mixer.

Examples of the manufacturing method include a method of adjusting the pH to a preset value and then performing mixing and a method of performing mixing and then adjusting the pH to a preset value. Furthermore, it is also possible to use a method of manufacturing a concentrated solution and then adjusting the concentration thereof to a predetermined value by diluting the solution at the time of use. In addition, the concentrated solution can be used after being diluted and then adjusted to a preset pH. Moreover, a preset amount of pure water for dilution can be added to the concentrated solution, or a predetermined amount of the concentrated solution can be added to pure water for dilution.

<Object to be Treated>

The chemical solution according to the embodiment of the present invention is used for removing a transition metal-containing substance on a substrate.

In the present specification, "on a substrate" includes, for example, all of the front and back, the lateral surfaces, and the inside of grooves of a substrate, and the like. The transition metal-containing substance on a substrate includes not only a transition metal-containing substance which directly contacts the surface of the substrate but also a transition metal-containing substance which is on the substrate through another layer.

Examples of the transition metal included in the transition metal-containing substance include a metal M selected from Ru (ruthenium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

That is, as the transition metal-containing substance, a substance including the metal M is preferable.

Particularly, the transition metal-containing substance is preferably a Ru-containing substance. That is, the chemical solution according to the embodiment of the present invention is more preferably used for removing the Ru-containing substance.

The content of Ru atoms in the Ru-containing substance with respect to the total mass of the Ru-containing substance is preferably equal to or greater than 10% by mass, more preferably equal to or greater than 30% by mass, and even more preferably equal to or greater than 50% by mass. The upper limit thereof is not particularly limited, but is 100% by mass for example.

The transition metal-containing substance only needs to be a substance including a transition metal (transition metal atoms), and examples thereof include a simple transition metal, an alloy including a transition metal, an oxide of a transition metal, a nitride of a transition metal, and an oxynitride of a transition metal. Among these, as the transition metal-containing substance, simple Ru, an alloy of Ru, an oxide of Ru, a nitride of Ru, or an oxynitride of Ru is preferable.

Furthermore, the transition metal-containing substance may be a mixture including two or more kinds of compounds among the above compounds.

The oxide, nitride, and oxynitride described above may be a composite oxide, a composite nitride, and a composite oxynitride including a transition metal.

The content of transition metal atoms in the transition metal-containing substance with respect to the total mass of the transition metal-containing substance is preferably equal to or greater than 10% by mass, more preferably equal to or greater than 30% by mass, and even more preferably equal to or greater than 50% by mass. The upper limit thereof is 100% by mass because the transition metal-containing substance may be a transition metal.

The object to be treated is a substrate having a transition metal-containing substance. That is, the object to be treated includes at least a substrate and a transition metal-containing substance on the substrate.

The type of the substrate is not particularly limited, but is preferably a semiconductor substrate.

Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The type of the transition metal-containing substance on the substrate is as described above.

The form of the transition metal-containing substance on the substrate is not particularly limited. For example, the transition metal-containing substance may be disposed in the form of a film (transition metal-containing film), in the form of wiring (transition metal-containing wiring), or in the form of particles. As described above, the transition metal is preferably Ru, and the object to be treated preferably has a substrate and a Ru-containing film, Ru-containing wiring, or a particle-like Ru-containing substance which is disposed on the substrate.

Examples of the substrate, on which the transition metal-containing substance is disposed in the form of particles, include a substrate obtained by performing dry etching on a substrate having a transition metal-containing film such that particle-like transition metal-containing substances are then attached to the substrate as residues as will be described later, and a substrate obtained by performing a chemical mechanical polishing (CMP) treatment on the transition metal-containing film such that particle-like transition metal-containing substances are then attached to the substrate as residues as will be described later.

The thickness of the transition metal-containing film is not particularly limited, and may be appropriately selected according to the use. For example, the thickness is preferably equal to or smaller than 50 nm, more preferably equal to or smaller than 20 nm, and even more preferably equal to or smaller than 10 nm.

The transition metal-containing film may be disposed only on one of the main surfaces of the substrate, or may be disposed on both the main surfaces of the substrate. Furthermore, the transition metal-containing film may be disposed on the entire main surface of the substrate, or may be disposed on a portion of the main surface of the substrate.

The substrate may have various layers and/or structures as desired in addition to the transition metal-containing substance. For example, the substrate may have metal wiring, a gate electrode, a source electrode, a drain electrode, an insulating layer, a ferromagnetic layer, and/or a non-magnetic layer, and the like.

The substrate may have the structure of an exposed integrated circuit, for example, an interconnection mechanism such as metal wiring and a dielectric material. Examples of metals and alloys used for the interconnect mechanism include aluminum, a copper-aluminum alloy, copper, titanium, tantalum, cobalt, silicon, titanium nitride, tantalum nitride, and tungsten. The substrate may have a layer of silicon oxide, silicon nitride, silicon carbide, and/or carbon-doped silicon oxide.

The size, thickness, shape, layer structure, and the like of the substrate are not particularly limited, and can be appropriately selected as desired.

As described above, the object to be treated used in the treatment method according to the embodiment of the present invention has a transition metal-containing substance on a substrate.

The method for manufacturing the substrate having the transition metal-containing substance is not particularly limited. For example, a transition metal-containing film can be formed on a substrate by a sputtering method, a chemical vapor deposition (CVD) method, a molecular beam epitaxy (MBE) method, or the like. In a case where the transition metal-containing film is formed by a sputtering method, a CVD method, or the like, sometimes the transition metal-containing substance is also attached to the back surface of the substrate having the transition metal-containing film (the surface opposite to the side of the transition metal-containing film).

Furthermore, transition metal-containing wiring may be formed on a substrate by performing the aforementioned method through a predetermined mask.

In addition, after the transition metal-containing film or the transition metal-containing wiring is formed on a substrate, the substrate may be further subjected to a different process or treatment and then used as the object to be treated by the treatment method of the present invention.

For example, by performing dry etching on a substrate having a transition metal-containing film or transition metal-containing wiring, a substrate having dry etching residues including a transition metal may be manufactured. Furthermore, by performing CMP on a substrate having a transition metal-containing film or transition metal-containing wiring, a substrate having a transition metal-containing substance may be manufactured.

[Method for Treating Substrate]

The method for treating a substrate according to an embodiment of the present invention (hereinafter, referred to as "present treatment method" as well) has a step A of removing a transition metal-containing substance on a substrate by using the chemical solution described above.

As described above, particularly, in a case where the transition metal-containing substance includes a Ru-containing substance, the method for treating a substrate according to the embodiment of the present invention is suitably used.

The chemical solution used in the present treatment method is as described above.

In addition, the substrate having a transition metal-containing substance, which is an object to be treated by the present treatment method, is as described above.

Examples of the specific method of the step A include a method of bringing the substrate having a transition metal-containing substance, which is an object to be treated, into contact with the chemical solution.

The method of bringing the substrate into contact with the chemical solution is not particularly limited, and examples thereof include a method of immersing the object to be treated in the chemical solution put in a tank, a method of spraying the chemical solution onto the substrate, a method of causing the chemical solution to flow on the substrate, and any combination of these. Among these, the method of immersing the substrate having a transition metal-containing substance, which is an object to be treated, in the chemical solution is preferable.

In order to further enhance the cleaning ability of the chemical solution, a mechanical stirring method may also be used.

Examples of the mechanical stirring method include a method of circulating the chemical solution on a substrate, a method of causing the chemical solution to flow on the substrate or spraying the chemical solution onto the substrate, a method of stirring the chemical solution by using ultrasonic or megasonic waves, and the like.

The treatment time of the step A can be adjusted according to the method of bringing the chemical solution into contact with the substrate, the temperature of the chemical solution, and the like. The treatment time (the contact time between the chemical solution and the object to be treated) is not particularly limited, but is preferably 0.25 to 10 minutes, and more preferably 0.5 to 2 minutes.

The temperature of the chemical solution during the treatment is not particularly limited, but is preferably 20° C. to 75° C. and more preferably 20° C. to 60° C.

In the step A, a treatment may be performed in which the concentration of the periodic acids and/or the specific compound in the chemical solution is measured and, if necessary, a solvent (preferably water) is added to the chemical solution. In a case where this treatment is performed, the concentration of components in the chemical solution can be stably maintained in a predetermined range.

The concentration of the periodic acids and/or the specific compound in the chemical solution is measured, for example, by ion chromatography. Specifically, examples of the device include Dionex ICS-2100 manufactured by Thermo Fisher Scientific.

Specifically, examples of suitable embodiments of the step A include a step A1 of performing a recess etching treatment on transition metal-containing wiring disposed on a substrate by using the chemical solution, a step A2 of removing a transition metal-containing film on outer edge portions of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, and a step A5 of removing a transition metal-containing substance on a substrate, which has undergone a chemical mechanical polishing treatment, by using the chemical solution.

Among these, as the step A, the step A2 or the step A3 is more preferable.

Hereinafter, the treatment method according to the embodiment of the present invention used in each of the above treatments will be described.

Step A1

Examples of the step A include a step A1 of performing a recess etching treatment on transition metal-containing wiring disposed on a substrate by using the chemical solution.

FIG. 1 is a schematic cross-sectional top view showing an example of a substrate having transition metal-containing wiring (hereinafter, referred to as "wiring substrate" as well) which is an object to be treated by the recess etching treatment in the step A1.

A wiring substrate 10a shown in FIG. 1 has a substrate not shown in the drawing, an insulating film 12 having a groove disposed on the substrate, a barrier metal layer 14 disposed along the inner wall of the groove, and transition metal-containing wiring 16 that fills up the inside of the groove.

The substrate and the transition metal-containing wiring in the wiring substrate are as described above.

As the transition metal-containing wiring, Ru-containing wiring (wiring including Ru) is preferable. It is preferable that the Ru-containing wiring includes simple Ru, an alloy of Ru, an oxide of Ru, a nitride of Ru, or an oxynitride of Ru.

The material constituting the barrier metal layer in the wiring substrate is not particularly limited, and examples thereof include TiN and TaN.

In FIG. 1, an embodiment is illustrated in which the wiring substrate has a barrier metal layer. However, the wiring substrate may not have the barrier metal layer.

The method for manufacturing the wiring substrate is not particularly limited, and examples thereof include a method including a step of forming an insulating film on a substrate, a step of forming a groove in the insulating film, a step of forming a barrier metal layer on the insulating film, a step of forming a transition metal-containing film that fills up the groove, and a step of performing a smoothing treatment on the transition metal-containing film.

In the step A1, by performing a recess etching treatment on the transition metal-containing wiring in the wiring substrate by using the aforementioned chemical solution, a portion of the transition metal-containing wiring can be removed, and a recess portion can be formed.

Figure 2:
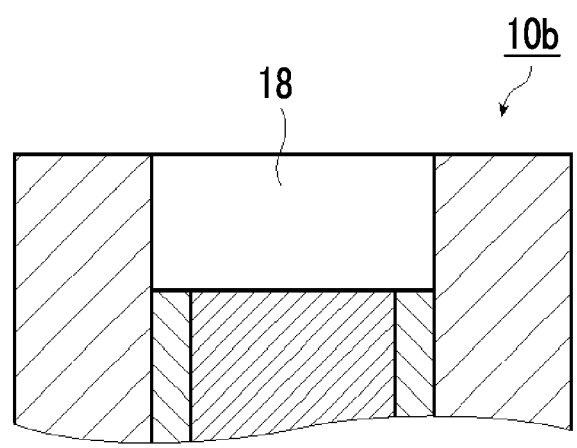
FIG. 2 is a schematic cross-sectional top view showing an example of an object to be treated having undergone the step A1.

More specifically, in a case where the step A1 is performed, as shown in the wiring substrate 10b in FIG. 2, a portion of the barrier metal layer 14 and the transition metal-containing wiring 16 is removed, and a recess portion 18 is formed.

Examples of the specific method of the step A1 include a method of bringing the wiring substrate into contact with the chemical solution.

The method of bringing the wiring substrate into contact with the chemical solution is as described above.

The suitable ranges of the contact time between the chemical solution and the wiring substrate and the temperature of the chemical solution are as described above.

After the step A1, if necessary, a step B of treating the substrate obtained by the step A1 by using a predetermined solution (hereinafter, referred to as "specific solution" as well) may be performed.

Particularly, as described above, in a case where the barrier metal layer is disposed on the substrate, the solubility in the chemical solution according to the embodiment of the present invention varies between the component constituting the transition metal-containing wiring and the component constituting the barrier metal layer depending on the type of the components. In this case, it is preferable to adjust the degree of solubility of the transition metal-containing wiring and the barrier metal layer by using a solution that dissolves better the barrier metal layer.

In this respect, as the specific solution, a solution is preferable which poorly dissolves the transition metal-containing wiring but excellently dissolves the substance constituting the barrier metal layer.

Examples of the specific solution include a solution selected from the group consisting of a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), and a mixed solution of hydrochloric acid and aqueous hydrogen peroxide (HPM).

The composition of FPM is, for example, preferably in a range of "hydrofluoric acid:aqueous hydrogen peroxide: water=1:1:1" to "hydrofluoric acid:aqueous hydrogen peroxide:water=1:1:200" (volume ratio).

The composition of SPM is, for example, preferably in a range of "sulfuric acid:aqueous hydrogen peroxide:water=3: 1:0" to "sulfuric acid:aqueous hydrogen peroxide:water=1: 1:10" (volume ratio).

The composition of APM is, for example, preferably in a range of "aqueous ammonia:aqueous hydrogen peroxide: water=1:1:1" to "aqueous ammonia:aqueous hydrogen peroxide:water=1:1:30" (volume ratio).

The composition of HPM is, for example, preferably in a range of "hydrochloric acid:aqueous hydrogen peroxide: water=1:1:1" to "hydrochloric acid:aqueous hydrogen peroxide:water=1:1:30" (volume ratio).

The preferred compositional ratio described above means a compositional ratio determined in a case where the content of hydrofluoric acid is 49% by mass, the content of sulfuric acid is 98% by mass, the content of aqueous ammonia is 28% by mass, the content of hydrochloric acid is 37% by mass, and the content of aqueous hydrogen peroxide is 31% by mass.

Among these, in view of dissolving ability for the barrier metal layer, SPM, APM, or HPM is preferable.

In view of reducing roughness, APM, HPM, or FPM is preferable, and APM is more preferable.

In view of achieving excellent balance between performances, APM or HPM is preferable.

In the step B, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the chemical solution.

The contact time between the specific solution and the substrate obtained by the step A1 is, for example, preferably 0.25 to 10 minutes, and more preferably 0.5 to 5 minutes.

In the present treatment method, the step A1 and the step B may be performed alternately.

In a case where the steps are performed alternately, it is preferable that each of the step A1 and the step B is performed 1 to 10 times.

<Step A2>

Examples of the step A include a step A2 of removing a transition metal-containing film at the outer edge portion of a substrate, on which the transition metal-containing film is disposed, by using the chemical solution.

Figure 3:
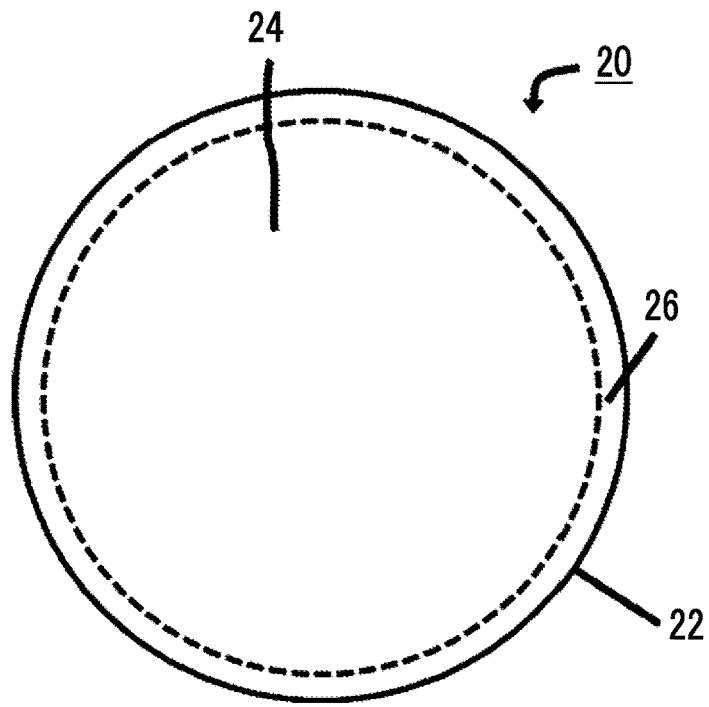
FIG. 3 is a schematic view showing an example of an object to be treated used in a step A2.

FIG. 3 is a schematic view (top view) showing an example of a substrate, on which a transition metal-containing film is disposed, as an object to be treated by the step A2.

An object 20 to be treated by the step A2 shown in FIG. 3 is a laminate having a substrate 22 and a transition metal-containing film 24 disposed on one main surface (entire region surrounded by the solid line) of the substrate 22. As will be described later, in step A2, the transition metal-containing film 24 positioned at an outer edge portion 26 (the region outside the broken line) of the object 20 to be treated is removed.

The substrate and the transition metal-containing film in the object to be treated are as described above.

As the transition metal-containing film, a Ru-containing film (film including Ru) is preferable. It is preferable that the Ru-containing film includes simple Ru, an alloy of Ru, an oxide of Ru, a nitride of Ru, or an oxynitride of Ru.

The specific method of the step A2 is not particularly limited, and examples thereof include a method of supplying the chemical solution from a nozzle such that the chemical solution contacts only the transition metal-containing film at the outer edge portion of the substrate.

At the time of performing the treatment of the step A2, it is possible to preferably use the substrate treatment device and the substrate treatment method described in JP-2010-267690A, JP2008-080288A, JP2006-100368A, and JP2002-299305A.

The method of bringing the object to be treated into contact with the chemical solution is as described above.

The suitable ranges of the contact time between the chemical solution and the object to be treated and the temperature of the chemical solution are as described above.

<Step A3>

Examples of the step A include a step A3 of removing a transition metal-containing substance attached to the back surface of a substrate, on which a transition metal-containing film is disposed, by using the chemical solution.

Examples of the object to be treated by the step A3 include the object to be treated used in the step A2. At the time of forming the object to be treated, which is constituted with a substrate and a transition metal-containing film disposed on one main surface of the substrate, used in the step A2, the transition metal-containing film is formed by sputtering, CVD, or the like. At this time, sometimes a transition metal-containing substance is attached to a surface (back surface) of the substrate that is opposite to the transition metal-containing film. The step A3 is performed to remove such a transition metal-containing substance in the object to be treated.

The specific method of the step A3 is not particularly limited, and examples thereof include a method of spraying the chemical solution such that the chemical solution contacts only the back surface of the substrate.

The method of bringing the object to be treated into contact with the chemical solution is as described above.

The suitable ranges of the contact time between the chemical solution and the object to be treated and the temperature of the chemical solution are as described above.

<Step A4>

Examples of the step A include a step A4 of removing a transition metal-containing substance on a substrate, which has undergone dry etching, by using the chemical solution.

Figure 4:
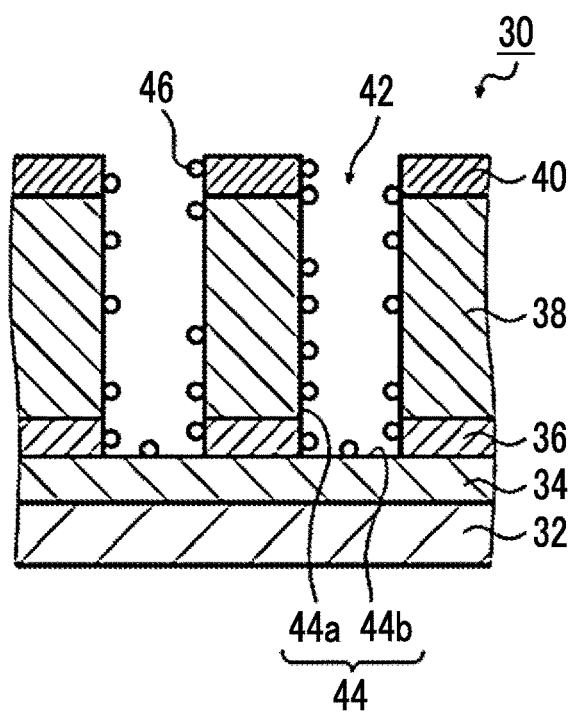
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a transition metal-containing film 34, an etch stop layer 36, an interlayer insulating film 38, a metal hard mask 40 in this order on a substrate 32. Through a dry etching process or the like, a hole 42 exposing the transition metal-containing film 34 is formed at a predetermined position. That is, the object to be treated shown in FIG. 4 is a laminate which comprises the substrate 32, the transition metal-containing film 34, the etch stop layer 36, the interlayer insulating film 38, and the metal hard mask 40 in this order and comprises the hole 42 that extends from the surface of the metal hard mask 40 to the surface of the transition metal-containing film 34 at the position of the opening portion of the mask 40. An inner wall 44 of the hole 42 is constituted with a cross-sectional wall 44a which consists of the etch stop layer 36, the interlayer insulating film 38, and the metal hard mask 40, and a bottom wall 44b which consists of the exposed transition metal-containing film 34. A dry etching residue 46 is attached to the inner wall 44.

The dry etching residue includes a transition metal-containing substance.

As the transition metal-containing film, a Ru-containing film (film including Ru) is preferable. It is preferable that the Ru-containing film includes simple Ru, an alloy of Ru, an oxide of Ru, a nitride of Ru, or an oxynitride of Ru.

As the transition metal-containing substance, a Ru-containing substance is preferable. It is preferable that the Ru-containing substance includes simple Ru, an alloy of Ru, an oxide of Ru, a nitride of Ru, or an oxynitride of Ru.

As the interlayer insulating film and the metal hard mask, known materials are selected.

Although FIG. 4 describes an embodiment in which a metal hard mask is used, a resist mask formed of a known photoresist material may also be used.

Examples of the specific method of the step A4 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

<Step A5>

Examples of the step A include a step A5 of removing a transition metal-containing substance on a substrate, which has undergone a chemical mechanical polishing (CMP), by using the chemical solution.

The CMP technique is used for smoothing an insulating film, smoothing connection holes, and a process of manufacturing damascene wiring and the like. In some cases, a substrate having undergone CMP is contaminated with a large amount of particles used as abrasive particles, metal impurities, and the like. Therefore, it is necessary to remove these contaminants and wash the substrate before the next processing stage starts. By performing the step A5, it is possible to remove a transition metal-containing substance which is generated in a case where the object to be treated by CMP has transition metal-containing wiring or a transition metal-containing film and attached onto the substrate.

As described above, examples of the object to be treated by the step A5 include a substrate having undergone CMP that has a transition metal-containing substance.

As the transition metal-containing substance, a Ru-containing substance is preferable. It is preferable that the Ru-containing substance includes simple Ru, an alloy of Ru, an oxide of Ru, a nitride of Ru, or an oxynitride of Ru.

Examples of the specific method of the step A5 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

<Step C>

If necessary, the present treatment step may have a step C of performing a rinsing treatment on the substrate obtained by the step A by using a rinsing solution after the step A.

In a case where the substrate is brought into contact with the chemical solution according to the embodiment of the present invention, sometimes an iodine compound derived from the chemical solution according to the embodiment of the present invention is attached to the surface of the substrate as residual iodine (I residue). Such residual iodine (I residue) may negatively affect the subsequent processes and/or end products. By performing the rinsing step, it is possible to remove the residual iodine (I residue) from the surface of the substrate.

As the rinsing solution, for example, hydrofluoric acid, hydrochloric acid, aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, or an aqueous orthoperiodic acid solution is preferable. As long as the purpose of the rinsing step is not impaired, these rinsing solutions may be used by being mixed together.

The hydrofluoric acid, nitric acid, perchloric acid, and hydrochloric acid mean aqueous solutions obtained by dissolving HF, $HNO_3$, $HClO_4$, and HCl in water respectively.

The sulfuric acid may be an aqueous solution obtained by dissolving $H_2SO_4$ in water.

The aqueous ozone, aqueous carbon dioxide, and aqueous hydrogen mean aqueous solutions obtained by dissolving $O_3$, $CO_2$, and $H_2$ in water respectively.

Among the above, as the rinsing solution, in view of further reducing iodine remaining on the surface of the substrate after the rinsing step, aqueous carbon dioxide, aqueous ozone, aqueous hydrogen, hydrofluoric acid, an aqueous citric acid solution, hydrochloric acid, sulfuric acid, aqueous ammonia, aqueous hydrogen peroxide, SPM, APM, HPM, IPA, an aqueous hypochlorous acid solution, aqua regia, or FPM is preferable, and hydrofluoric acid, hydrochloric acid, aqueous hydrogen peroxide, SPM, APM, HPM, or FPM is more preferable.

Examples of the specific method of the step C include a method of bringing the substrate as an object to be treated obtained by the step A into contact with the rinsing solution.

The method of bringing the substrate into contact with the rinsing solution is performed by immersing the substrate in the rinsing solution put in a tank, spraying the rinsing solution onto the substrate, causing the rinsing solution to flow on the substrate, or any combination of these.

The treatment time (contact time between the rinsing solution and the object to be treated) is not particularly limited, but is 5 seconds to 5 minutes.

The temperature of the rinsing solution during the treatment is not particularly limited, but is preferably 16° C. to 60° C., and more preferably 18° C. to 40° C.

If necessary, the present treatment method may have a step D of performing a drying treatment after the step C. The method of the drying treatment is not particularly limited, and examples thereof include spin drying, causing a drying gas to flow on the substrate, heating the substrate by a heating unit such as a hot plate or an infrared lamp, isopropyl alcohol (IPA) vapor drying, Marangoni drying, Rotagoni drying, and any combination of these.

The drying time varies with the specific method to be used, but is about 30 seconds to a few minutes in general.

The present treatment method may be performed in combination before or after other steps performed on a substrate. While being performed, the present treatment method may be incorporated into those other steps. Alternatively, while those other steps are being performed, the treatment method according to the embodiment of the present invention may be incorporated into the steps and performed.

Examples of those other steps include a step of forming each structure such as metal wiring, a gate structure, a source structure, a drain structure, an insulating layer, a ferromagnetic layer and/or a nonmagnetic layer (layer formation, etching, chemical mechanical polishing, modification, and the like), a step of forming resist, an exposure step and a removing step, a heat treatment step, a washing step, an inspection step, and the like.

The present treatment method may be performed in the back end process (BEOL: Back end of the line) or in the front end process (FEOL: Front end of the line). However, from the view point of enabling the effects of the present invention to be further demonstrated, it is preferable to perform the present treatment method in the front end process.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples.

Example A

[Preparation of Chemical Solution]

Chemical solutions to be used in each test were prepared according to the formulations shown in the following Table 1.

The abbreviations in Table 1, which are for periodic acid, specific compounds, and pH adjusters used for preparing the chemical solutions, mean the following compounds.

(Periodic acid)
Ortho: Orthoperiodic acid
Meta: Metaperiodic acid
(Specific compound)
TMAI: Tetramethylammonium iodide
TEAI: Tetraethylammonium iodide
TBAI: Tetrabutylammonium iodide
$TMAIO_3$: Tetramethylammonium iodate
$TEAIO_3$: Tetraethylammonium iodate
$TBAIO_3$: Tetrabutylammonium iodate
(PH adjuster)
TMAH: Tetramethylammonium hydroxide
TEAH: Tetraethylammonium hydroxide
TBAH: Tetrabutylammonium hydroxide
DGA: Diglycolamine
AH212: Bishydroxyethyldimethylammonium hydroxide (manufactured by Yokkaichi Chemical Company Limited.)
[Test]

Substrates were prepared in which a ruthenium layer was formed on one surface of a commercial silicon wafer (diameter: 12 inches) by a chemical vapor deposition (CVD) method. The thickness of the ruthenium layer was 15 nm.

Each of the obtained substrates was put in a container filled with a chemical solution, and the chemical solution was stirred to perform a ruthenium layer removal treatment. The temperature of the chemical solution was 60° C.

[Evaluation]
<Dissolving Ability>
The time taken for the ruthenium layer to disappear (time required for removal) was measured, and the dissolving ability of the chemical solution was evaluated based on the following standard.

The shorter the time required for removal, the better the dissolving ability of the chemical solution.

A: Time required for removal≤30 seconds
B: 30 seconds<time required for removal≤45 seconds
C: 45 seconds<time required for removal≤60 seconds
D: 60 seconds<time required for removal≤120 seconds
E: 120 seconds<time required for removal <Smoothness>
At a point in time when the removal treatment had been performed for half of the time required for removal checked in the evaluation of dissolving ability, the removal treatment was stopped, the surface of the ruthenium layer was observed with a scanning electron microscope, and the smoothness of the portion to be treated was evaluated based on the following standard.

In a case where a chemical solution graded E by the evaluation of dissolving ability was used, at a point in time when the removal treatment had been performed for 120 seconds, the surface of the ruthenium layer was observed with a scanning electron microscope, and the smoothness was evaluated.

A: The surface of the ruthenium layer is smooth and has no roughness.
B: The surface of the ruthenium layer is smooth and substantially has no roughness.
C: The surface of the ruthenium layer is smooth and has slight roughness (having roughness higher than that in B).
D: The surface of the ruthenium layer is rough, but the roughness is at an acceptable level.
E: The surface of the ruthenium layer is rough.

The results are shown in the following table.

The number described in the column of "Content of specific compound" represents the mass percentage of the content of the specific compound with respect to the total mass of the chemical solution.

Each of the pH adjusters was added in such an amount that the chemical solution had an intended pH.

The balance of the chemical solution is water.

TABLE 1

| | Periodic acids | | Specific compound | | | | Periodic | | |
| | Type | Content % by mass | Type | Content % by mass | pH adjuster Type | pH of chemical solution | acids/ Specific compound | Dissolving ability (Ru) | Smoothness (Ru) |
|---|---|---|---|---|---|---|---|---|---|
| Example A1 | Ortho | 8.0 | HI | 0.1 | N/A | 1.0 | $8.0 \times 10^1$ | C | D |
| Example A2 | Ortho | 8.0 | $HIO_3$ | 1 | N/A | 1.0 | $8.0 \times 10^0$ | D | B |
| Example A3 | Ortho | 8.0 | $HIO_3$ | 0.1 | N/A | 1.0 | $8.0 \times 10^1$ | B | B |
| Example A4 | Ortho | 15.0 | $HIO_3$ | 0.5 | N/A | 0.5 | $3.0 \times 10^1$ | A | C |
| Example A5 | Ortho | 25.0 | $HIO_3$ | 0.8 | N/A | 0.3 | $3.1 \times 10^1$ | A | C |
| Example A6 | Ortho | 37.0 | $HIO_3$ | 1 | N/A | 0.1 | $3.7 \times 10^1$ | A | D |
| Example A7 | Ortho | 8.0 | $HIO_3$ | 0.01 | N/A | 1.0 | $8.0 \times 10^2$ | B | C |
| Example A8 | Ortho | 8.0 | $HIO_3$ | 0.001 | N/A | 1.0 | $8.0 \times 10^3$ | B | C |
| Example A9 | Ortho | 8.0 | $HIO_3$ | 0.0001 | N/A | 1.0 | $8.0 \times 10^4$ | B | C |
| Example A10 | Ortho | 8.0 | $HIO_3$ | 5 ppm by mass | N/A | 1.0 | $1.6 \times 10^4$ | B | C |
| Example A11 | Ortho | 8.0 | $HIO_3$ | 5 ppb by mass | N/A | 1.0 | $1.6 \times 10^7$ | B | D |
| Example A12 | Ortho | 8.0 | $NH_4I$ | 0.3 | N/A | 1.0 | $2.7 \times 10^1$ | C | D |
| Example A13 | Ortho | 8.0 | TMAI | 0.3 | N/A | 1.0 | $2.7 \times 10^1$ | C | D |
| Example A14 | Ortho | 8.0 | TEAI | 0.3 | N/A | 1.0 | $2.7 \times 10^1$ | C | D |
| Example A15 | Ortho | 8.0 | TBAI | 0.3 | N/A | 1.0 | $2.7 \times 10^1$ | C | D |
| Example A16 | Ortho | 8.0 | $NH_4IO_3$ | 0.3 | N/A | 1.0 | $2.7 \times 10^1$ | C | D |
| Example A17 | Ortho | 8.0 | $TMAIO_3$ | 0.3 | N/A | 1.0 | $2.7 \times 10^1$ | C | C |
| Example A18 | Ortho | 8.0 | $TEAIO_3$ | 0.3 | N/A | 1.0 | $2.7 \times 10^1$ | C | C |
| Example A19 | Ortho | 8.0 | $TBAIO_3$ | 0.3 | N/A | 1.0 | $2.7 \times 10^1$ | C | C |
| Example A20 | Ortho | 8.0 | $HIO_3$ | 0.3 | TEAH | 2.5 | $2.7 \times 10^1$ | A | B |
| Example A21 | Ortho | 8.0 | $HIO_3$ | 0.3 | TEAH | 4.5 | $2.7 \times 10^1$ | A | A |
| Example A22 | Ortho | 8.0 | $HIO_3$ | 0.3 | TEAH | 6.0 | $2.7 \times 10^1$ | C | B |
| Example A23 | Ortho | 8.0 | $HIO_3$ | 0.3 | TEAH | 8.0 | $2.7 \times 10^1$ | D | B |
| Example A24 | Ortho | 2.0 | $HIO_3$ | 0.1 | TEAH | 2.5 | $2.0 \times 10^1$ | C | A |
| Example A25 | Ortho | 2.0 | $HIO_3$ | 0.1 | TEAH | 4.5 | $2.0 \times 10^1$ | B | A |
| Example A26 | Ortho | 0.5 | $HIO_3$ | 0.25 | TEAH | 4.5 | $2.0 \times 10^0$ | C | A |
| Example A27 | Ortho | 0.1 | $HIO_3$ | 0.05 | TEAH | 4.5 | $2.0 \times 10^0$ | D | A |
| Example A28 | Ortho | 2.0 | $HIO_3$ | 0.1 | TEAH | 6.0 | $2.0 \times 10^1$ | C | A |
| Example A29 | Ortho | 2.0 | $HIO_3$ | 0.1 | TEAH | 8.0 | $2.0 \times 10^1$ | D | A |
| Example A30 | Ortho | 2.0 | $HIO_3$ | 0.1 | TMAH | 4.5 | $2.0 \times 10^1$ | B | B |
| Example A31 | Ortho | 2.0 | $HIO_3$ | 0.1 | TBAH | 4.5 | $2.0 \times 10^1$ | B | B |
| Example A32 | Ortho | 2.0 | $HIO_3$ | 0.1 | Aqueous ammonia | 4.5 | $2.0 \times 10^1$ | B | B |
| Example A33 | Ortho | 2.0 | $HIO_3$ | 0.1 | DGA | 4.5 | $2.0 \times 10^1$ | B | B |
| Example A34 | Ortho | 2.0 | $HIO_3$ | 0.1 | Sulfuric acid | 0.0 | $2.0 \times 10^1$ | C | B |
| Example A35 | Ortho | 2.0 | $HIO_3$ | 0.1 | Hydrochloric acid | 0.0 | $2.0 \times 10^1$ | C | B |
| Example A36 | Ortho | 2.0 | $HIO_3$ | 0.1 | Hydrofluoric acid | 0.0 | $2.0 \times 10^1$ | C | B |
| Example A37 | Ortho | 2.0 | $HIO_3$ | 0.1 | Perchloric acid | 0.0 | $2.0 \times 10^1$ | C | B |

TABLE 1-continued

|  | Periodic acids | | Specific compound | | | | Periodic | | |
| --- | --- | --- | --- | --- | --- | --- | --- | --- | --- |
|  | Type | Content % by mass | Type | Content % by mass | pH adjuster Type | pH of chemical solution | acids/ Specific compound | Dissolving ability (Ru) | Smoothness (Ru) |
| Example A38 | Meta | 8.0 | $HIO_3$ | 0.1 | N/A | 1.0 | $8.0 \times 10^1$ | B | B |
| Example A39 | Ortho | 8.0 | $HIO_3$ | 0.3 | AH212 | 2.5 | $2.7 \times 10^1$ | A | A |
| Comparative Example A1 | Ortho | 8.0 | N/A | — | N/A | 1.0 | — | C | E |
| Comparative Example A2 | Ortho | 8.0 | N/A | — | TEAH | 4.5 | — | B | E |
| Comparative Example A3 | N/A | — | $HIO_3$ | 0.5 | N/A | 1.8 | — | E | D |
| Comparative Example A4 | Ortho | 8.0 | $HIO_3$ | 2.0 | N/A | 0.8 | — | E | B |

From the results shown in the table, it has been confirmed that the chemical solution according to the embodiment of the present invention has excellent dissolving ability for a transition metal-containing substance and can realize excellent smoothness of a portion to be treated.

It has been confirmed that in view of further improving the dissolving ability of the chemical solution, the content (total content) of the periodic acids is preferably greater than 0.1% by mass, more preferably greater than 0.5% by mass, even more preferably greater than 2.0% by mass, and particularly preferably greater than 8.0% by mass (comparison of Examples A3, A4, A21, and A25 to 27).

It has been confirmed that in view of further improving the smoothness of the portion to be treated, the content of the periodic acid is preferably equal to or smaller than 35.0% by mass, and more preferably less than 15.0% by mass (comparison of Examples A2 to A6).

It has been confirmed that in view of further improving the smoothness of the chemical solution, the content of the specific compound is preferably greater than 0.01% by mass (comparison between Examples A3 and A7).

It has been confirmed that in view of further improving the balance between the dissolving ability of the chemical solution and the smoothness of the portion to be treated, a compound including $IO_3^-$ is preferable as the specific compound (comparison between Examples A1 and A3, and the like).

It has been confirmed that in view of further improving the smoothness of the portion to be treated, the cations included in the specific compound are preferably $H^+$, $TMA^+$, $TEA^+$, and $TBA^+$ (more preferably, H+) (comparison of Example A2, A3, and A16 to A19).

In addition, it has been confirmed that in view of further improving the dissolving ability of the chemical solution, the pH of the chemical solution is preferably lower than 8.0 (comparison between Examples A22 and A23).

Particularly, it has been confirmed that in a case where the pH of the chemical solution is higher than 1.0 and equal to or lower than 6.0 (more preferably equal to or higher than 3.0 and equal to or lower than 5.0), the balance between the dissolving ability of the chemical solution and the smoothness of the portion to be treated is further improved (comparison of Examples A2, A3 and A20 to A22, and comparison of Examples A24, A25, and A28).

It has been confirmed that in view of further improving the dissolving ability of the chemical solution, TMAH, TEAH, TBAH, aqueous ammonia, and DGA are preferable as the pH adjuster (comparison of Examples A25 and A30 to A37).

Furthermore, it has been confirmed that in view of further improving the smoothness of the portion to be treated, as the pH adjuster, TEAH and AH212 (bishydroxyethyldimethylammonium hydroxide) are preferable, and AH212 is more preferable (comparison of Examples A25 and A30 to A37 and comparison between Examples A20 and A40).

Example B

[Test]

By using the chemical solution of Example A3, until the ruthenium layer disappeared, the ruthenium layer removal treatment was performed by the same method as that in Example A.

The substrate having undergone the ruthenium layer removal treatment was put in a container filled with a rinsing solution shown in the following table, and the rinsing solution was stirred for 0.5 minute so as to perform a rinsing step. The temperature of the rinsing solution was 25° C.

The meanings of the abbreviations for rinsing solutions in the table and contents are as below.

In Example B, The aqueous carbon dioxide, the aqueous ozone, and the aqueous hydrogen mean aqueous solutions obtained by dissolving $CO_2$, ozone, and $H_2$ in water in an amount of 50 ppm by mass, 30 ppm by mass, and 15 ppm by mass respectively.

The hydrofluoric acid, the aqueous citric acid solution, the hydrochloric acid, the sulfuric acid, the aqueous ammonia, the aqueous hydrogen peroxide, and the aqueous hypochlorous acid solution mean aqueous solutions obtained by dissolving HF, citric acid, HCl, $H_2SO_4$, $NH_3$, $H_2O_2$, and HClO in water such that the content of each of these compounds with respect to the total mass of the rinsing solution became the value of mass percentage described in the column of "Content".

IPA means isopropyl alcohol.

The aqua regia means aqua regia obtained by mixing 37% by mass of hydrochloric acid with 60% by mass of nitric acid at a volume ratio of 3:1.

SPM means a mixed solution obtained by mixing 98% by mass of sulfuric acid with 31% by mass of aqueous hydrogen peroxide at a volume ratio of 3:1.

APM means a mixed solution obtained by mixing together 28% by mass of aqueous ammonia, 31% by mass of aqueous hydrogen peroxide, and water at a volume ratio of 1:1:5.

HPM means a mixed solution obtained by mixing together 37% by mass of an aqueous hydrochloric acid solution, 31% by mass of aqueous hydrogen peroxide, and water at a volume ratio of 1:1:5.

FPM means a mixed solution obtained by mixing together 49% by mass of hydrofluoric acid, 31% by mass of aqueous hydrogen peroxide, and water at a volume ratio of 1:1:5.

[Evaluation]

<I Residue>

The surface of the substrate having undergone the rinsing step was measured using a total reflection X-ray fluorescence spectrometer (device name: TREX-610 manufactured by TECHNOS Co., Ltd.), and an iodine atom concentration (I atom concentration) on the surface was measured and evaluated according to the following standard.

A: I atom concentration≤$1.0×10^8$ atoms/cm$^2$
B: $1.0×10^8$ atoms/cm$^2$<I atom concentration≤$1.0×10^{10}$ atoms/cm$^2$
C: $1.0×10^{10}$ atoms/cm$^2$<I atom concentration The results are shown in the following table.

TABLE 2

| | Specific solution | | |
| --- | --- | --- | --- |
| | Type | Content % by mass, ppm by mass, or volume ratio | I residue |
| Example B1 | Ultrapure water | 100% by mass | C |
| Example B2 | Aqueous carbon dioxide | 50 ppm by mass | B |
| Example B3 | Aqueous ozone | 30 ppm by mass | B |
| Example B4 | Aqueous hydrogen | 15 ppm by mass | B |
| Example B5 | Hydrofluoric acid | 1% by mass | A |
| Example B6 | Aqueous citric acid solution | 1% by mass | B |
| Example B7 | Hydrochloric acid | 5% by mass | A |
| Example B8 | Sulfuric acid | 5% by mass | B |
| Example B9 | Aqueous ammonia | 5% by mass | B |
| Example B10 | Aqueous hydrogen peroxide | 5% by mass | A |
| Example B11 | SPM | 3:1 | A |
| Example B12 | APM | 1:1:5 | A |
| Example B13 | HPM | 1:1:5 | A |
| Example B14 | IPA | 100% by mass | B |
| Example B15 | Aqueous hypochlorous acid solution | 2% by mass | B |
| Example B16 | Aqua regia | 3:1 | B |
| Example B17 | FPM | 1:1:5 | A |

From the results shown in the table, it has been confirmed that in view of further reducing iodine atoms remaining on the surface of the substrate having undergone the rinsing step, as the rinsing solution, aqueous carbon dioxide, aqueous ozone, aqueous hydrogen, hydrofluoric acid, an aqueous citric acid solution, hydrochloric acid, sulfuric acid, aqueous ammonia, aqueous hydrogen peroxide, SPM, APM, HPM, IPA, an aqueous hypochlorous acid solution, aqua regia, or FPM is preferable, and hydrofluoric acid, hydrochloric acid, aqueous hydrogen peroxide, SPM, APM, HPM, or FPM is more preferable.

Example C

[Test]

A stopper film and an interlayer insulating film ($SiO_2$) were formed in this order on an 8-inch silicon wafer. A wiring groove (width: 50 nm, depth: 400 nm) was formed in the interlayer insulating film of the silicon wafer, a barrier metal layer consisting of a titanium nitride (TiN) film was then deposited to a thickness of 5 nm on the entire surface by a sputtering method, and a ruthenium layer was deposited until the wiring groove was filled. Thereafter, the ruthenium layer and the barrier metal layer were subjected to a CMP treatment until the interlayer insulating film was exposed. The obtained substrate had a barrier metal layer along the inner wall of the wiring groove of the interlayer insulating film, in which the inside of the barrier metal layer was filled with the ruthenium layer.

This substrate was put in a container filled with the chemical solution of Example A3, and the chemical solution was stirred to perform a ruthenium layer removal treatment (recess etching treatment for wiring). The removal treatment was performed until ruthenium filled up the wiring groove to half of the height of the groove.

Thereafter, the substrate was put in a container filled with a specific solution described in the following table, and the solution was stirred to perform a treatment for removing the barrier metal layer that was exposed on the surface by the removal of the ruthenium layer (treatment step using a specific solution). At this time, the temperature of the specific solution was 60° C.

The FPM, SPM, APM, and HPM used for the specific solution are the same as those used in Example B.

[Evaluation]

<TiN Dissolving Ability>

The time taken for the barrier metal layer exposed on the surface to disappear (time required for removal) was measured, and the TiN dissolving ability of the specific solution was evaluated based on the following standard.

The shorter the time required for removal, the better the TiN dissolving ability of the specific solution.

A: Time required for removal≤1 minute
B: 1 minute<time required for removal≤3 minutes
C: 3 minutes<time required for removal <Interface Roughness>

The interface (border line) between the ruthenium layer and the barrier metal layer in the substrate, which had undergone the treatment for removing the barrier metal layer exposed on the surface, was observed along the normal direction of the substrate by using a scanning electron microscope, and the roughness of the interface (such as recesses in the border line) was evaluated based on the following standard.

A: The interface has no defect and no roughness.
B: The interface has no defect and substantially does not have roughness.
C: Some defects are observed in the interface, and the interface has slight roughness (the roughness is higher than that in B but is at acceptable level).

The results are shown in the following table.

TABLE 3

| | Specific solution | | TiN | TiN/Ru |
| --- | --- | --- | --- | --- |
| | Compound | Volume ratio | dissolving ability | Interfacial roughness |
| Example C1 | SPM | 3:1 | A | C |
| Example C2 | APM | 1:1:5 | A | A |
| Example C3 | HPM | 1:1:5 | A | B |
| Example C4 | FPM | 1:1:5 | B | B |

From the results shown in the table, it has been confirmed that in view of TiN dissolving ability, SPM, APM, or HPM is preferable.

It has been confirmed that in view of the roughness of the interface between the ruthenium layer and the barrier metal layer, APM, HPM, or FPM is preferable, and APM is more preferable.

Example D

[Test]

By using a chemical solution having the same formulation as that of the chemical solution of Example 21 in Example A, the same test as that in Example A was performed on substrates on which a layer consisting of various metals or metal compounds shown in Table 4 was formed instead of the ruthenium layer.

[Evaluation]
<Dissolving Ability>

The time taken for the layer consisting of various metals or metal compounds to disappear (time required for removal) was measured, and the dissolving ability of the chemical solution was evaluated based on the same standard as that in Example A.

The results are shown in the following table.

TABLE 4

|  | Dissolving ability | | | | |
| --- | --- | --- | --- | --- | --- |
|  | Ru | Co | RuMn | ZrOx | Cr |
| Example D1 | A | A | A | C | C |

From the results shown in the table, it has been confirmed that the chemical solution according to the embodiment of the present invention can be applied to a wide variety of transition metals and transition metal compounds.

Example E

Example E1

A ruthenium layer, a SiOC-based interlayer insulating film, a $SiO_2$ film, and a metal hard mask (TiN) having an opening portion were formed in this order on a silicon wafer, and dry etching was performed on the wafer by using the metal hard mask as a mask, and via holes through which the ruthenium layer was exposed were formed on the bottom, thereby obtaining a patterned substrate.

The obtained patterned substrate was treated by being immersed for 1 minute in the chemical solution of Example 21 in Example A at 60° C. After the immersion, the patterned substrate was immediately rinsed with ultrapure water and dried with $N_2$. The cross section and the surface of the patterned substrate were checked using a scanning electron microscope. As a result, no dry etching residue was found on the inside of the via holes.

In contrast, as a result of checking the patterned substrate, which had not been subjected to the treatment described above, by using a scanning electron microscope and an X-ray fluorescence spectrometer, dry etching residues including ruthenium were found on the inner wall of the via holes.

Example E2

The substrate, on which the ruthenium layer was formed, used in Example A was subjected to a treatment in which the substrate was rotated, and the chemical solution of Example 21 in Example A was sprayed for 60 seconds from a nozzle at a position 5 mm distant from the edge of the rotating substrate.

As a result of checking the substrate having undergone the treatment, it has been confirmed that the ruthenium layer formed at the outer edge portion of the substrate has disappeared.

Example E3

The substrate, on which the ruthenium layer was formed, used in Example A was subjected to a treatment in which the substrate was rotated, and the chemical solution of Example 21 in Example A was sprayed for 60 seconds from a nozzle disposed on the side opposite to the ruthenium layer of the rotating substrate.

As a result of checking the substrate having undergone the treatment, it has been confirmed that no ruthenium-containing substance is present on the back surface of the substrate.

EXPLANATION OF REFERENCES

10a: wiring substrate not yet being subjected to recess etching treatment for wiring
10b: wiring substrate having undergone recess etching treatment for wiring
12: interlayer insulating film
14: barrier metal layer
16: transition metal-containing wiring
18: recess portion
20, 30: object to be treated
22: substrate
24: transition metal-containing film
26: outer edge portion
32: substrate
34: transition metal-containing film
36: etch stop layer
38: interlayer insulating film
40: metal hard mask
42: hole
44: inner wall
44a: cross-sectional wall
44b: bottom wall
46: dry etching residue

What is claimed is:

1. A chemical solution used for removing a transition metal-containing substance on a substrate, comprising:
   one or more kinds of periodic acids selected from the group consisting of a periodic acid and a salt thereof; and
   a compound including one or more kinds of anions selected from the group consisting of $IO_3^-$, $I^-$, and $I_3^-$,
   wherein the content of the compound including anions with respect to the total mass of the chemical solution is 5 ppb by mass to 1% by mass, and
   the ratio of the content of the compound including anions to the content of the periodic acids is $1\times10^0$ to $1\times10^8$.

2. The chemical solution according to claim 1, wherein the periodic acids include at least one compound selected from the group consisting of orthoperiodic acid, a salt of orthoperiodic acid, metaperiodic acid, and a salt of metaperiodic acid.

3. The chemical solution according to claim 1, wherein the content of the periodic acids with respect to the total mass of the chemical solution is equal to or smaller than 37.0% by mass.

4. The chemical solution according to claim 1, wherein the content of the periodic acids with respect to the total mass of the chemical solution is 2.0% to 8.0% by mass.

5. The chemical solution according to claim 1,
wherein the compound including anions includes at least one compound selected from the group consisting of iodic acid, tetramethylammonium iodate, tetraethylammonium iodate, tetrabutylammonium iodate, ammonium iodate, hydrogen iodide, tetramethylammonium iodide, tetraethylammonium iodide, tetrabutylammonium iodide, ammonium iodide, and nitrogen triiodide.

6. The chemical solution according to claim 1,
wherein the compound including anions includes a cation selected from the group consisting of a hydrogen cation, a tetramethylammonium cation, a tetraethylammonium cation, and a tetrabutylammonium cation.

7. The chemical solution according to claim 1,
wherein the transition metal-containing substance includes at least one metal selected from the group consisting of Ru, Ti, Ta, Co, Cr, Hf, Os, Pt, Ni, Mn, Cu, Zr, Mo, La, W, and Ir.

8. The chemical solution according to claim 1,
wherein the transition metal-containing substance includes a Ru-containing substance.

9. The chemical solution according to claim 1, further comprising:
a pH adjuster.

10. The chemical solution according to claim 9,
wherein the pH adjuster includes at least one compound selected from the group consisting of tetramethylammonium hydroxide, tetraethylammonium hydroxide, tetrabutylammonium hydroxide, aqueous ammonia, a water-soluble amine, sulfuric acid, hydrochloric acid, acetic acid, nitric acid, hydrofluoric acid, perchloric acid, and hypochlorous acid.

11. The chemical solution according to claim 9,
wherein the pH adjuster includes at least one compound selected from the group consisting of tetramethylammonium hydroxide, tetraethylammonium hydroxide, tetrabutylammonium hydroxide, aqueous ammonia, and a water-soluble amine.

12. The chemical solution according to claim 1 that has a pH lower than 8.0.

13. The chemical solution according to claim 1 that has a pH of 2.5 to 5.0.

14. A method for treating a substrate, comprising:
a step A of removing a transition metal-containing substance on a substrate by using the chemical solution according to claim 1.

15. The method for treating a substrate according to claim 14,
wherein the transition metal-containing substance includes a Ru-containing substance.

16. The method for treating a substrate according to claim 14,
wherein the step A is a step A1 of performing a recess etching treatment on transition metal-containing wiring disposed on a substrate by using the chemical solution, a step A2 of removing a transition metal-containing film at an outer edge portion of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, or a step A5 of removing a transition metal-containing substance on a substrate, which has undergone a chemical mechanical polishing treatment, by using the chemical solution.

17. The method for treating a substrate according to claim 16 that has the step A1 as the step A, further comprising:
a step B of treating the substrate obtained by the step A1 by using a solution selected from the group consisting of a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide after the step A1.

18. The method for treating a substrate according to claim 17,
wherein the step A1 and the step B are alternately repeated.

19. The method for treating a substrate according to claim 14, further comprising:
a step C of performing a rinsing treatment on the substrate obtained by the step A by using a rinsing solution after the step A.

20. The method for treating a substrate according to claim 19,
wherein the rinsing solution is a solution selected from the group consisting of hydrofluoric acid, hydrochloric acid, aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, and an aqueous orthoperiodic acid solution.

21. The method for treating a substrate according to claim 14,
wherein the temperature of the chemical solution is 20° C. to 75° C.

22. A chemical solution used for removing a transition metal-containing substance on a substrate, comprising:
one or more periodic acids selected from the group consisting of a periodic acid and a salt thereof; and
a compound including one or more anions selected from the group consisting of $IO_3^-$, $I^-$, and $I_3^-$,
wherein the content of the compound including anions with respect to the total mass of the chemical solution is 5 ppb by mass to 1% by mass, and
the content of the periodic acids with respect to the total mass of the chemical solution is 0.1% to 35% by mass.

23. The chemical solution according to claim 22,
wherein the content of the compound including anions with respect to the total mass of the chemical solution is 0.1% to 1% by mass.

24. The chemical solution according to claim 22,
wherein the periodic acids include at least one compound selected from the group consisting of orthoperiodic acid, a salt of orthoperiodic acid, metaperiodic acid, and a salt of metaperiodic acid.

25. The chemical solution according to claim 22,
wherein the ratio of the content of the compound including anions to the content of the periodic acids is $1\times10^0$ to $1\times10^8$.

26. The chemical solution according to claim 22,
wherein the compound including anions includes at least one compound selected from the group consisting of iodic acid, tetramethylammonium iodate, tetraethylammonium iodate, tetrabutylammonium iodate, ammonium iodate, hydrogen iodide, tetramethylammonium iodide, tetraethylammonium iodide, tetrabutylammonium iodide, ammonium iodide, and nitrogen triiodide.

27. The chemical solution according to claim 22,
wherein the compound including anions includes a cation selected from the group consisting of a hydrogen cation, a tetramethylammonium cation, a tetraethylammonium cation, and a tetrabutylammonium cation.

28. The chemical solution according to claim 22,
wherein the transition metal-containing substance includes at least one metal selected from the group consisting of Ru, Ti, Ta, Co, Cr, Hf, Os, Pt, Ni, Mn, Cu, Zr, Mo, La, W, and Ir.

29. The chemical solution according to claim 22,
wherein the transition metal-containing substance includes a Ru-containing substance.

30. The chemical solution according to claim 22, further comprising:
a pH adjuster.

31. The chemical solution according to claim 30,
wherein the pH adjuster includes at least one compound selected from the group consisting of tetramethylammonium hydroxide, tetraethylammonium hydroxide, tetrabutylammonium hydroxide, aqueous ammonia, a water-soluble amine, sulfuric acid, hydrochloric acid, acetic acid, nitric acid, hydrofluoric acid, perchloric acid, and hypochlorous acid.

32. The chemical solution according to claim 30,
wherein the pH adjuster includes at least one compound selected from the group consisting of tetramethylammonium hydroxide, tetraethylammonium hydroxide, tetrabutylammonium hydroxide, aqueous ammonia, and a water-soluble amine.

33. The chemical solution according to claim 22 that has a pH lower than 8.0.

34. The chemical solution according to claim 1 that has a pH of 2.5 to 5.0.

* * * * *